(12) United States Patent
Naganawa (10) Patent No.: US 6,946,867 B2
(45) Date of Patent: Sep. 20, 2005

(54) DATA OUTPUT CIRCUIT AND DATA OUTPUT METHOD

(75) Inventor: Koji Naganawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/644,013

(22) Filed: Aug. 20, 2003

(65) Prior Publication Data

US 2004/0255062 A1 Dec. 16, 2004

(30) Foreign Application Priority Data

Aug. 21, 2002 (JP) ...................................... 2002-240035

(51) Int. Cl.[7] .......................................... H03K 19/003
(52) U.S. Cl. ......................................... 326/27; 326/33
(58) Field of Search ................ 326/26–28, 21, 326/31, 33

(56) References Cited

U.S. PATENT DOCUMENTS

| | | | |
|---|---|---|---|
| 4,587,445 A | | 5/1986 | Kanuma |
| 4,667,337 A | | 5/1987 | Fletcher |
| 5,287,327 A | * | 2/1994 | Takasugi ............... 365/230.02 |
| 5,931,927 A | | 8/1999 | Takashima |
| 6,005,422 A | | 12/1999 | Morinaka et al. |
| 6,046,943 A | * | 4/2000 | Walker ................... 365/189.05 |
| 6,243,779 B1 | * | 6/2001 | Devanney et al. .......... 710/305 |
| 6,400,633 B1 | | 6/2002 | Al-Shamma et al. |

FOREIGN PATENT DOCUMENTS

| | | |
|---|---|---|
| EP | 0 444 774 A3 | 1/1991 |
| EP | 0 675 447 A1 | 10/1995 |
| EP | 0 886 200 A3 | 1/2003 |
| EP | 1 403 774 A1 | 3/2004 |
| GB | 2 345 423 | 7/2000 |
| JP | 2-310762 | 12/1990 |
| JP | 4-303234 | 10/1992 |
| JP | 7-20973 | 1/1995 |
| JP | 9-8671 | 1/1997 |
| WO | WO 97/11420 | 3/1997 |
| WO | WO 02/039290 A3 | 5/2002 |

OTHER PUBLICATIONS

Copy of United Kingdom Patent Office Examination Report dated Apr. 19, 2005.

* cited by examiner

*Primary Examiner*—James H. Cho
(74) *Attorney, Agent, or Firm*—Dickstein, Shapiro, Morin & Oshinsky, LLP.

(57) ABSTRACT

A data output circuit which outputs data on an internal bus line onto an external bus line includes a comparator, inverter, and controller. The comparator compares data on the external bus line and data to be output on the internal bus line. The inverter outputs a signal obtained by inverting the data on the internal bus line when the number of changed bits exceeds half the total number of bits on the basis of an output result from the comparator. The controller outputs an inversion display signal representing that the data has been inverted. A data output method is also disclosed.

9 Claims, 8 Drawing Sheets

PRIOR ART FIG. 11A LATCH SIGNAL 12
PRIOR ART FIG. 11B READ DATA BUS SIGNAL 10i
PRIOR ART FIG. 11C LATCH DATA BUS SIGNAL 20i
PRIOR ART FIG. 11D DATA OUTPUT REQUEST SIGNAL 11
PRIOR ART FIG. 11E OUTPUT DATA 40i

DATA OUTPUT CIRCUIT AND DATA OUTPUT METHOD

BACKGROUND OF THE INVENTION

The present invention relates to a data output circuit and data output method and, more particularly, to a data output system which reads out data stored in a semiconductor memory onto an internal bus line and outputs the data onto an external bus line.

The data transfer amount increases in electronic devices such as an information processing apparatus which incorporates a memory device such as a semiconductor memory. Multibit apparatuses in which the number of signals (number of bits) of the memory data bus increases from conventional 8 bits or 16 bits to 32 bits or 64 bits in addition to a higher data processing speed in the circuit are put into practical use from the prototyping stage.

Along with this, measures such as an increase in power capacitance value are required to increase the supply current of the power device of a system apparatus and prevent a power supply voltage drop caused by the switching (signal change) current of an instantaneously flowing data bus signal. The memory power design in the apparatus power design becomes important more and more.

The following problems occur depending on the memory used owing to a multibit data bus signal of the memory and a higher processing speed described above.

First, switching a data signal output from the memory has high power consumption. In addition, the internal power supply voltage fluctuates upon switching. Not only devices using the same power supply but also devices not using this power supply may malfunction. Especially in a cell phone, the frequency component of fluctuations in power supply voltage may influence the radio characteristic or the like. This is because a plurality of bits are simultaneously switched due to a multibit data bus.

Figure 10:
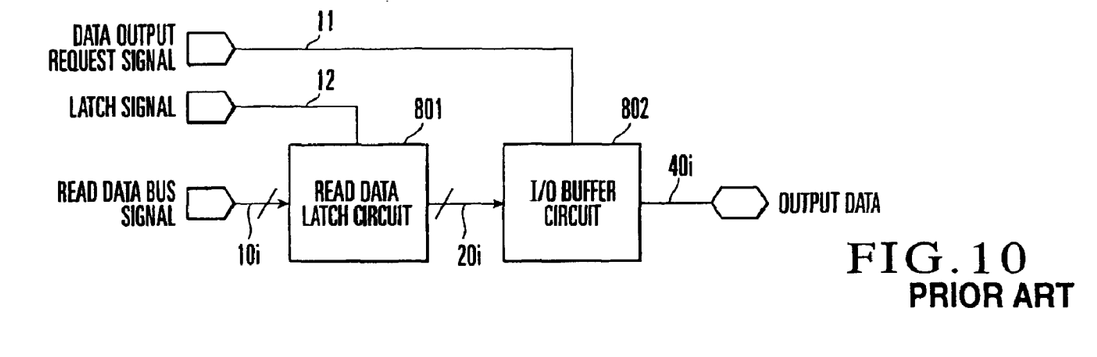
FIG. 10 is a block diagram showing an example of a conventional data output circuit.
Figure 11A:
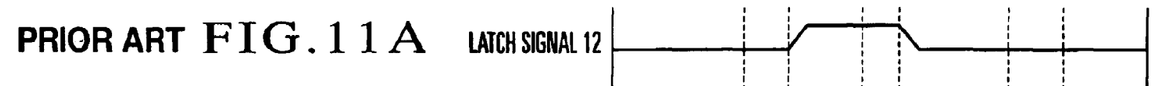
FIGS. 11A to 11E are timing charts showing the operation waveforms of blocks in FIG. 10.
Figure 11B:
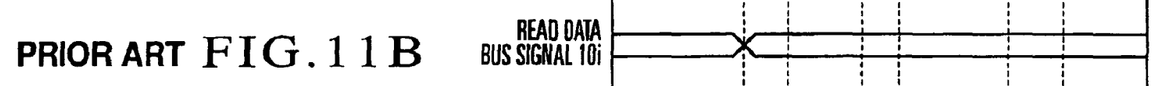
Figure 11C:
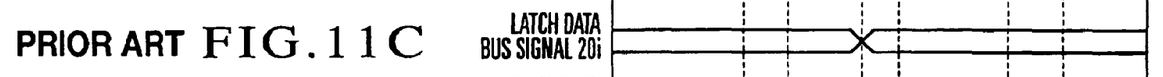
Figure 11D:
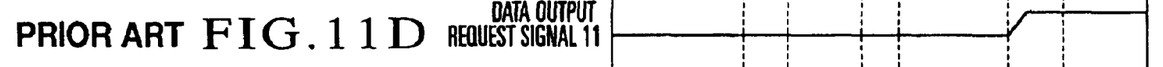
Figure 11E:
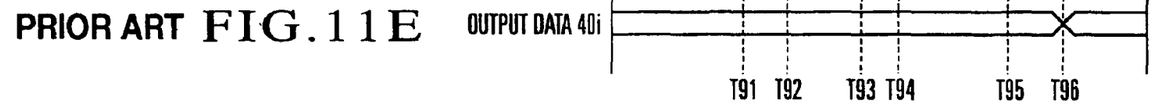

An example of a data output circuit in a conventional semiconductor memory will be described with reference to FIG. 10. In FIG. 10, data on a bus has n bits (n is an integer of 2 or more). That is, the width of each bus which transmits data has n bits.

A data bus signal $10i$ (i is 0 to n) as an output from the read amplifier of a memory (not shown) is input to a read data latch circuit 801, and latched in response to a latch signal 12. The latch output passes as a latch data bus signal $20i$ through an I/O (Input/Output) buffer circuit 802, and is output as output data $40i$ onto an external bus in response to a data output request signal 11.

The change timings of signals are represented by T91 to T96 in FIGS. 11A to 11E. In this data output circuit, if a plurality of bits in the output data $40i$ are simultaneously switched at timing T96, current consumption increases, and the power supply voltage fluctuates owing to a multibit data bus (this means n is larger), as described above. Fluctuations in power supply voltage appear as noise, which generates various adverse effects.

SUMMARY OF THE INVENTION

It is an object of the present invention to provide a data output circuit which reduces instantaneous current consumption generated by switching a data signal in outputting data onto an external data bus, suppresses variations in power supply voltage, and reduces noise.

To achieve the above object, according to the present invention, there is provided a data output circuit which outputs data on an internal bus line onto an external bus line, comprising comparison means for comparing data on the external bus line and data to be output on the internal bus line, inversion means for outputting a signal obtained by inverting the data on the internal bus line when the number of changed bits exceeds half the total number of bits on the basis of an output result from the comparison means, and control means for outputting an inversion display signal representing that the data has been inverted.

DESCRIPTION OF THE PREFERRED EMBODIMENTS

Preferred embodiments of the present invention will be described below with reference to the accompanying drawings.

A data output circuit according to an embodiment of the present invention will be explained with reference to FIG. 1.

A data output circuit 100 according to the embodiment comprises a read amplifier 1, a read data latch circuit 2 which is connected to the read amplifier, an output data control circuit 3 which is connected to the read data latch circuit 2, and an I/O circuit 4 which is connected to the output data control circuit 3.

A latch signal 12 is input to the read data latch circuit 2, whereas a data output request signal 11 is input to the I/O circuit 4.

Figure 1:
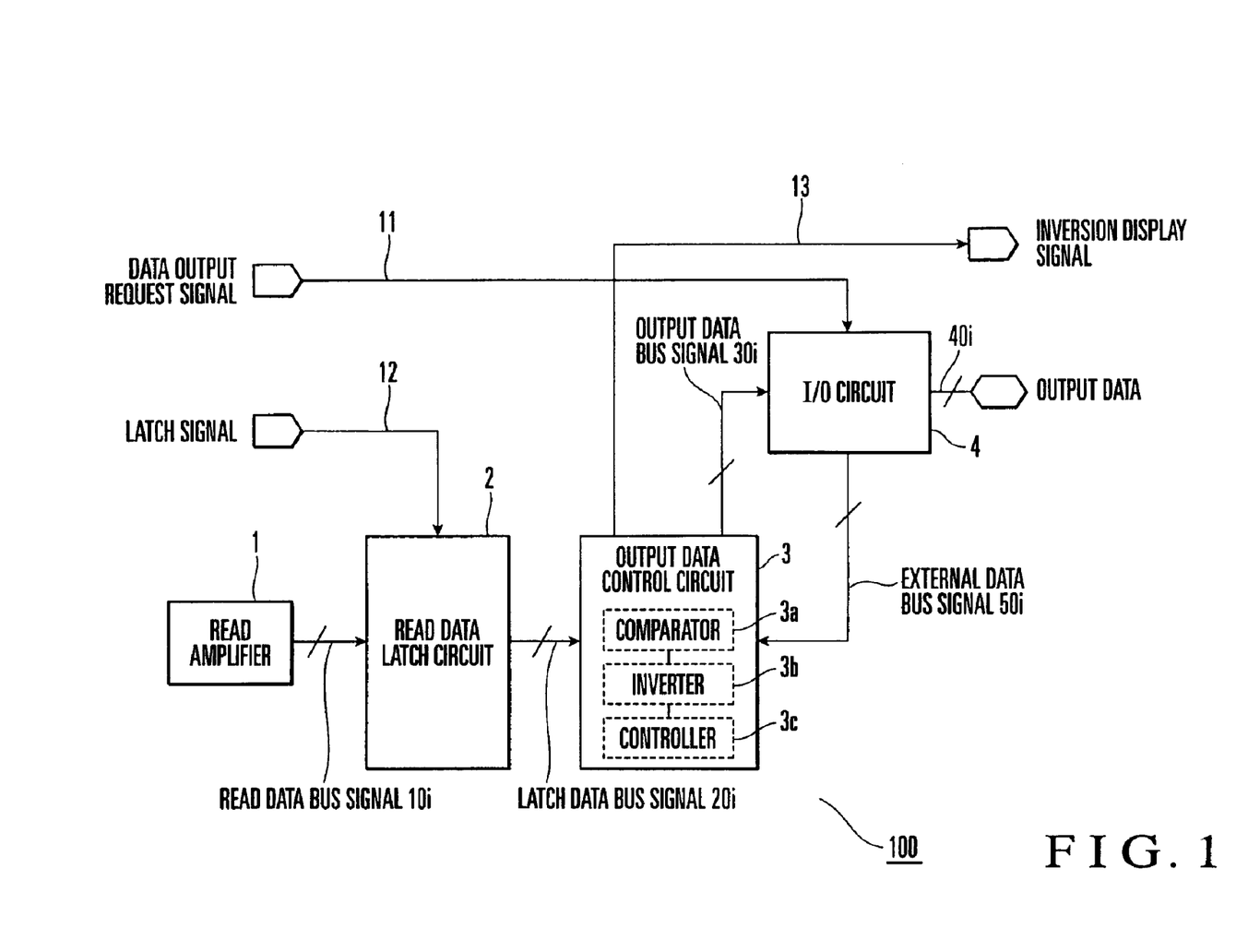
FIG. 1 is a functional block diagram for explaining a data output circuit according to an embodiment of the present invention.

In FIG. 1, the bit width of a data bus is n. A read data bus signal $10i$ (i is 0 to n) from the read amplifier (amplifier which amplifies data read from a semiconductor memory) 1 is input to the read data latch circuit 2, and latched in response to the latch signal 12. A latch data bus signal $20i$ as a latch output is input to the output data control circuit 3.

The output data control circuit 3 compares bit by bit the input latch data bus signal $20i$, and data (to be referred to as an external data bus signal 50i) which is identical to output data 40i currently present on an external data bus. If the number of changed bits exceeds half the total number of bits, the output data control circuit 3 inverts all the bits of the latch data bus signal 20i, and outputs the resultant signal as an output data bus signal 30i. The output data control circuit 3 generates and outputs an inversion display signal 13 representing that data has been inverted.

That is, the output data control circuit 3 comprises a comparator 3a which compares bit by bit the input latch data bus signal 20i and data identical to the output data 40i currently present on the external data bus, an inverter 3b which is connected to the comparator 3a, and when the comparator 3a determines that the number of changed bits exceeds half the total number of bits, outputs a signal obtained by inverting all the bits of the latch data bus signal 20i, and a controller 3c which is connected to the inverter 3b and outputs an inversion display signal representing that data has been inverted.

The I/O circuit 4 transmits the output data bus signal 30i from the output data control circuit 3 as the output data 40i to the external data bus. Also, the I/O circuit 4 feeds back the output data 40i as the external data bus signal 50i to the output data control circuit 3.

Figure 2:
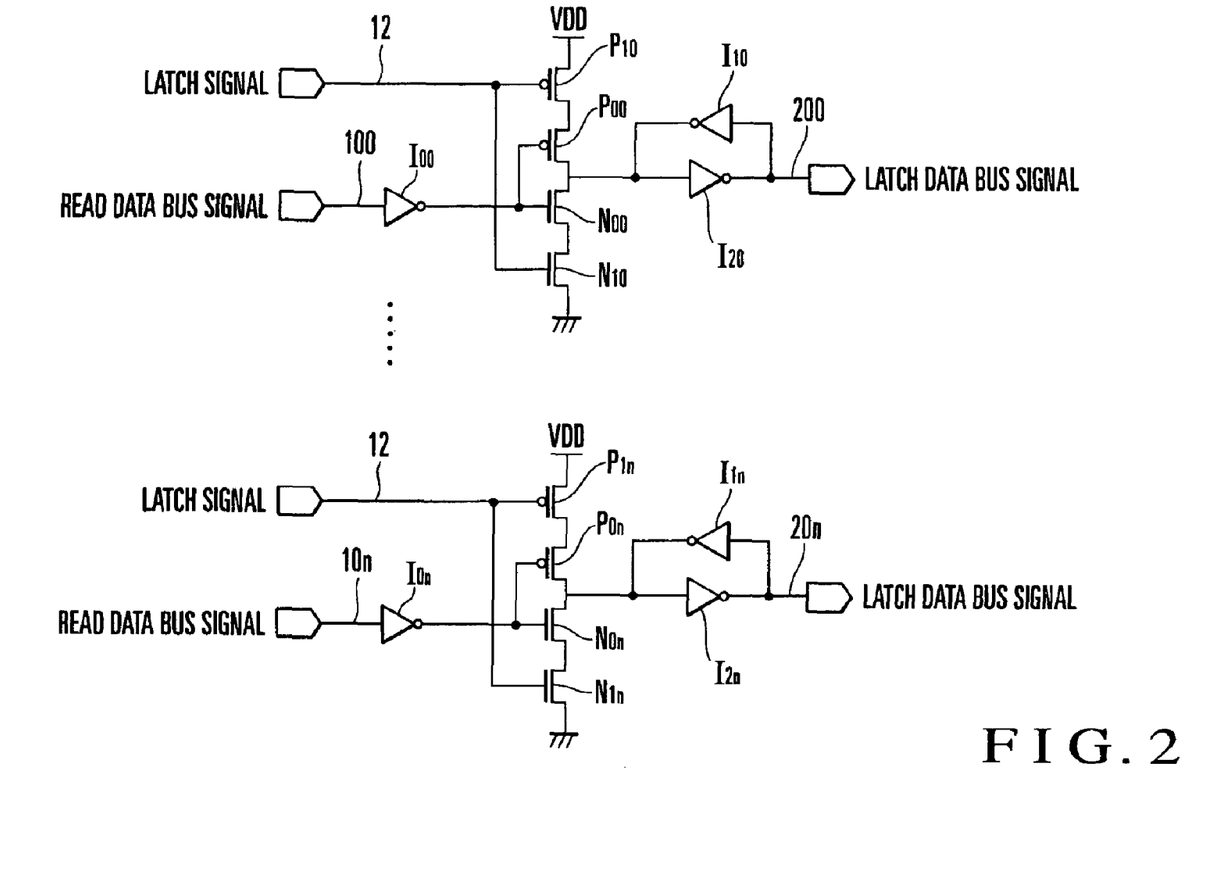
FIG. 2 is a circuit diagram showing an example of a read data latch circuit 2 in FIG. 1.

FIG. 2 shows an example of the read data latch circuit 2 in FIG. 1. Latch circuits are arranged in correspondence with the bits of the input read data bus signal 10i. FIG. 2 shows only latch circuits for i=0 and i=n, and latch circuits for i=1 to n-1 also have the same arrangement.

Only a latch circuit corresponding to the 0th bit of the read data bus signal 10i, i.e., i=0 will be explained. The read data bus signal 100 is input to the gates of N- and P-channel transistors $N_{00}$ and $P_{00}$ which are series-connected via an inverter $I_{00}$.

The latch signal 12 is supplied to the gate of an N-channel transistor $N_{10}$ between the transistor $N_{00}$ and ground, and also to the gate of a P-channel transistor $P_{10}$ between the transistor $P_{00}$ and power supply $V_{DD}$.

A latch portion formed from an inverter loop of two inverters $I_{10}$ and $I_{20}$ is arranged between the series-connection point between the transistors $N_{00}$ and $P_{00}$, and the output point of the latch data bus signal 200.

With this arrangement, the read data bus signal 100 is latched by the latch portion of the inverter loop at the timing of the latch signal 12. This also applies to the remaining read data bus signals 101 to 10n.

Figure 3:
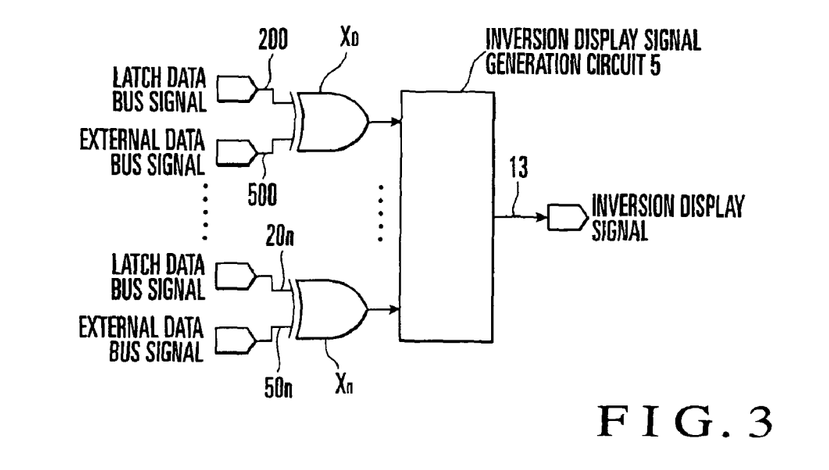
FIG. 3 is a circuit diagram showing an example of the data comparison portion of an output data control circuit 3 in FIG. 1.
Figure 4:
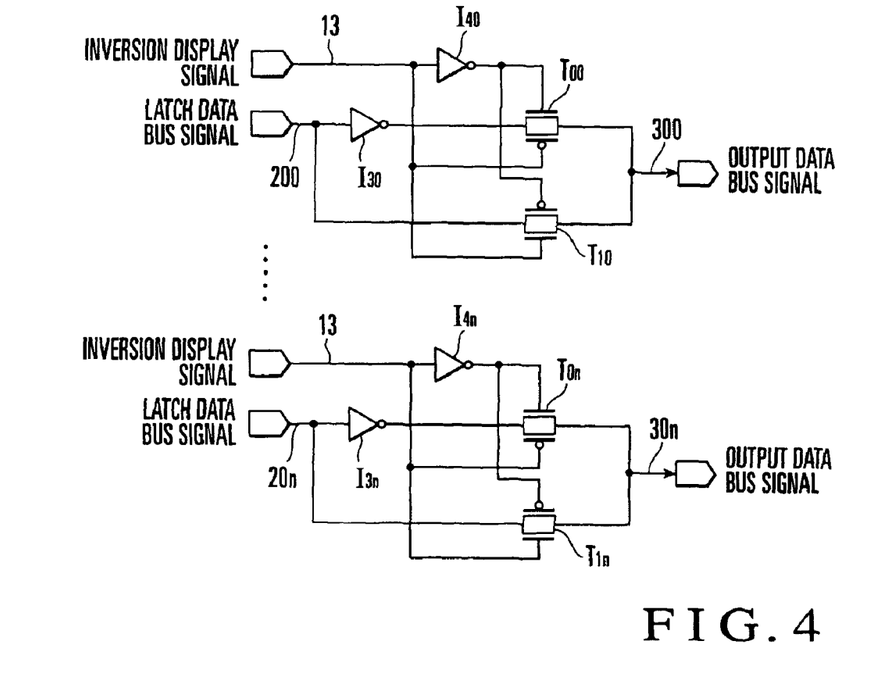
FIG. 4 is a circuit diagram showing an example of the data inversion control portion of the output data control circuit 3 in FIG. 1.
Figure 5A:
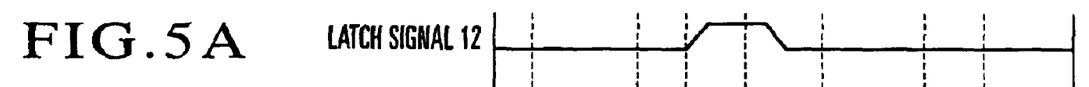
FIGS. 5A to 5H are timing charts showing the operation waveforms of blocks in FIG. 1.
Figure 5B:
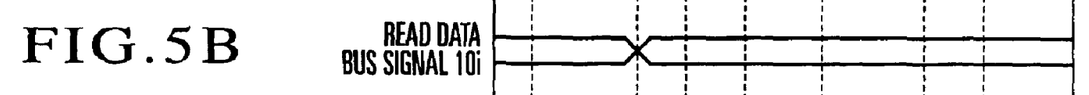
Figure 5C:
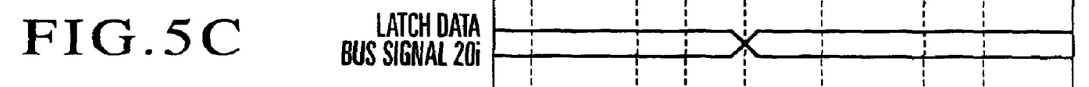
Figure 5D:
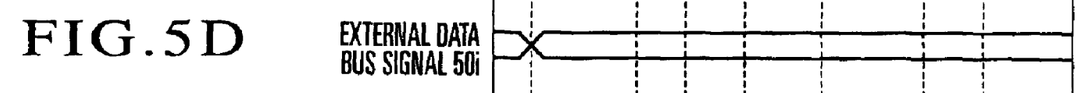
Figure 5E:
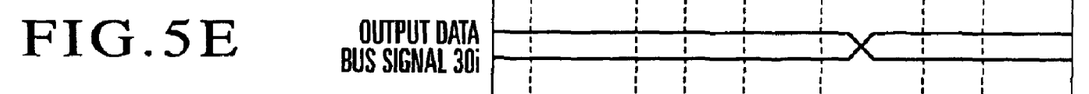
Figure 5F:
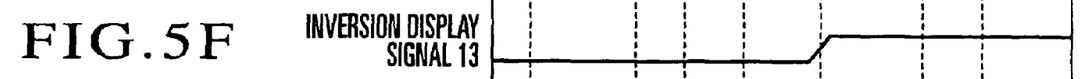
Figure 5G:
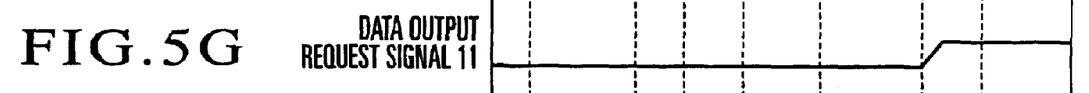
Figure 5H:
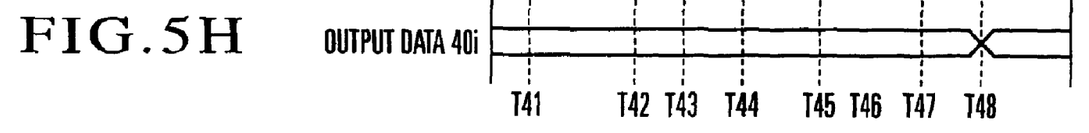

FIGS. 3 and 4 show an example of the output data control circuit 3 in FIG. 1.

FIG. 3 shows a circuit example of the data comparison portion (comparator 3a) in the output data control circuit 3. The data comparison portion comprises exclusive-OR circuits $X_i$ which compare bit by bit the latch data bus signals 20i and external data bus signals 50i, and an inversion display signal generation circuit 5 which receives exclusive-OR outputs, and when bits exceeding half the total number of bits are determined to have been inverted, generates the inversion display signal 13.

The inversion display signal 13 represents that the latch data bus signal 20i has been inverted.

A circuit example of the data inversion control portion (inverter 3b) in the output data control circuit 3 will be explained with reference to FIG. 4. Circuits at the data inversion control portion are arranged in correspondence with the bits of the latch data bus signal 20i. FIG. 4 shows only circuits for the 0th and nth bits. These circuits are identical for all the bits, and only a circuit corresponding to the 0th bit will be explained.

The latch data bus signal 200 is input to a transfer gate $T_{00}$ via an inverter $I_{30}$. The latch data bus signal 200 is also directly input to a transfer gate $T_{10}$. The transfer gates $T_{00}$ and $T_{10}$ are ON/OFF-controlled by the complimentary signal (by an inverter $I_{40}$) of the inversion display signal 13. Outputs from the transfer gates $T_{00}$ and $T_{10}$ are output as the output data bus signal 300.

With this arrangement, when the inversion display signal 13 is active (high level), the transfer gate $T_{00}$ is ON, and a signal obtained by inverting the latch data bus signal 200 by the inverter $I_{30}$ is output as the output data bus signal 300.

When the inversion display signal 13 is not active (low level), the transfer gate $T_{10}$ is ON, and the latch data bus signal 200 is directly output as the output data bus signal 300.

An example of a timing chart representing the operation waveforms of the portions of the circuit blocks described above will be explained with reference to FIGS. 5A to 5H. The read data bus signal 10i is output from the read amplifier 1 by memory read operation (T42).

In response to the latch signal 12 generated inside the device (T43) after the start of read operation, the read data latch circuit 2 latches the read data bus signal 10i, and outputs the signal 10i as the latch data bus signal 20i (T44).

At this time, the output data control circuit 3 compares bit by bit the external data bus signal 50i received at the start of read operation (T41), and the latch data bus signal 20i.

If the number of bits changed in data currently present on an external bus line exceeds half the total number of bits in outputting data, the inversion display signal 13 becomes active, and the latch data bus signal 20i is inverted and output as the output data bus signal 30i. At the same time, the inversion display signal 13 which becomes active and represents that data has been inverted is also output (T45).

If the data change does not exceed half the total number of bits, the latch data bus signal 20i is directly output as the output data bus signal 30i without any inversion, and an inactive inversion display signal 13 is also output.

In response to the data output request signal 11 (T47), the output data 40i is output from the I/O circuit 4 to the external data bus (T48).

Figure 6:
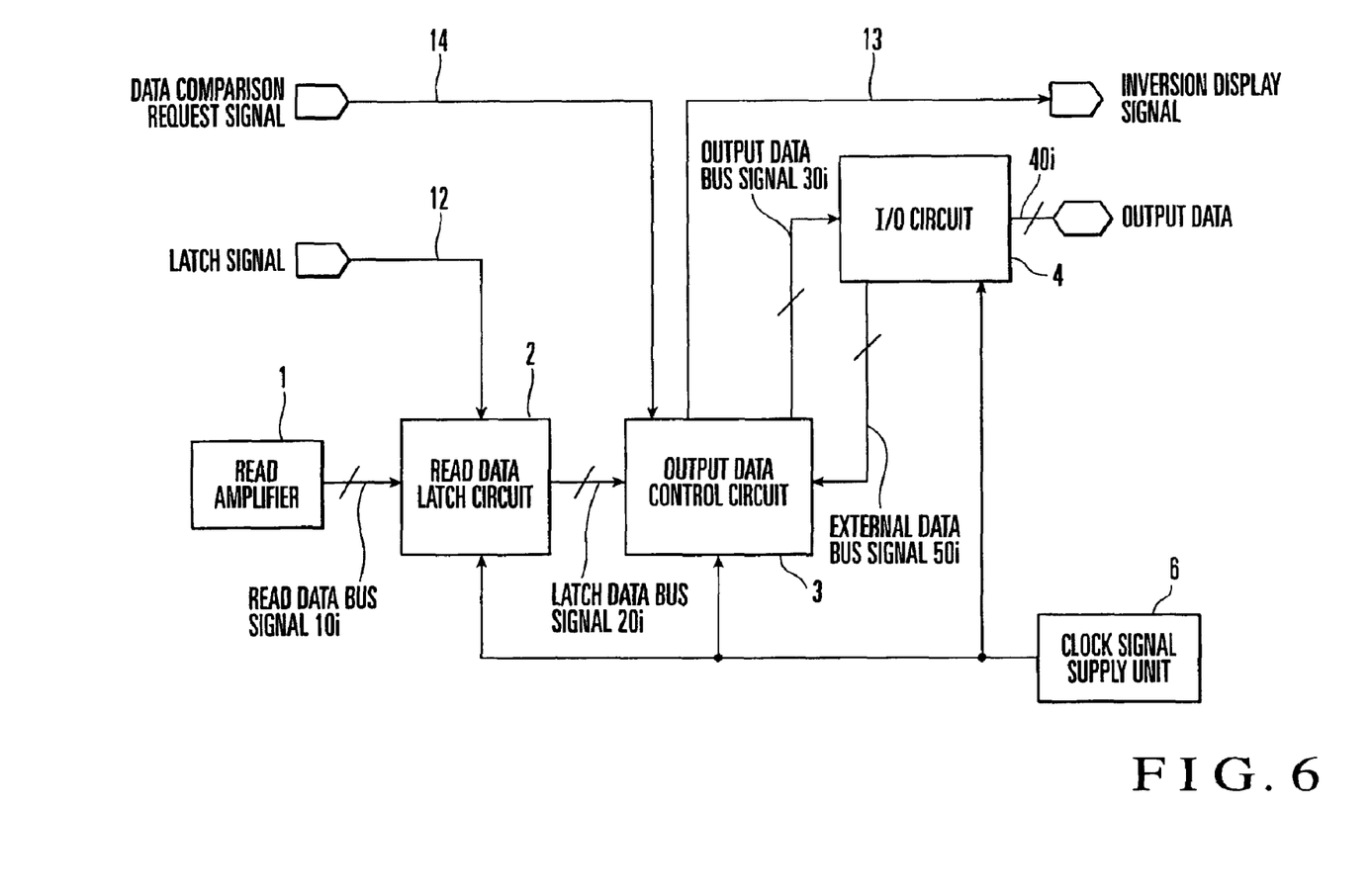
FIG. 6 is a functional block diagram for explaining a data output circuit according to another embodiment of the present invention.

Another embodiment of the present invention will be described with reference to FIG. 6. In FIG. 6, the same reference numerals as in FIG. 1 denote the same parts.

In this embodiment, a clock signal CLK is added to the arrangement of FIG. 1, and along with this, the data output request signal 11 in FIG. 1 is omitted. The example of FIG. 6 is a clocked circuit which outputs data on an internal bus line as memory read data onto an external bus line in synchronism with the cycle of the clock signal.

Figure 7:
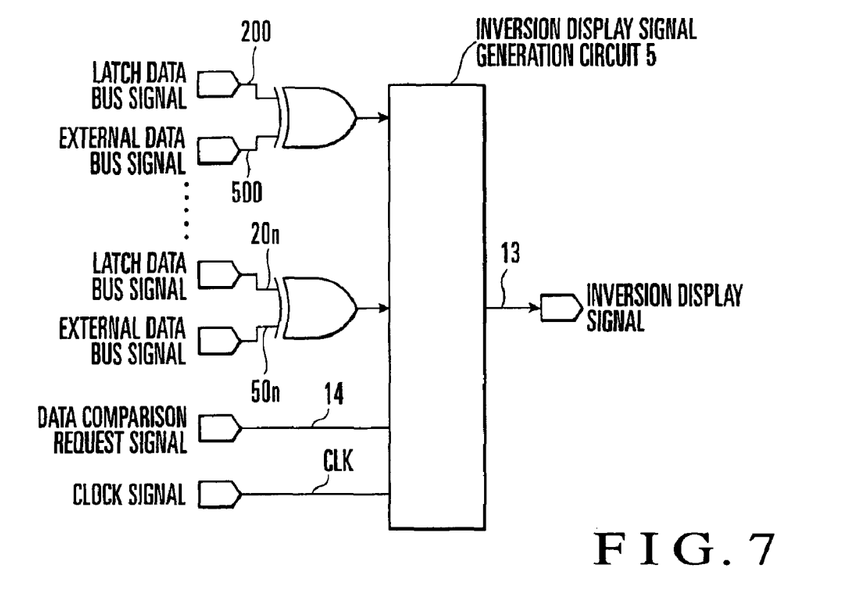
FIG. 7 is a circuit diagram showing an example of the data comparison portion of an output data control circuit 3 in FIG. 6.
Figure 8:
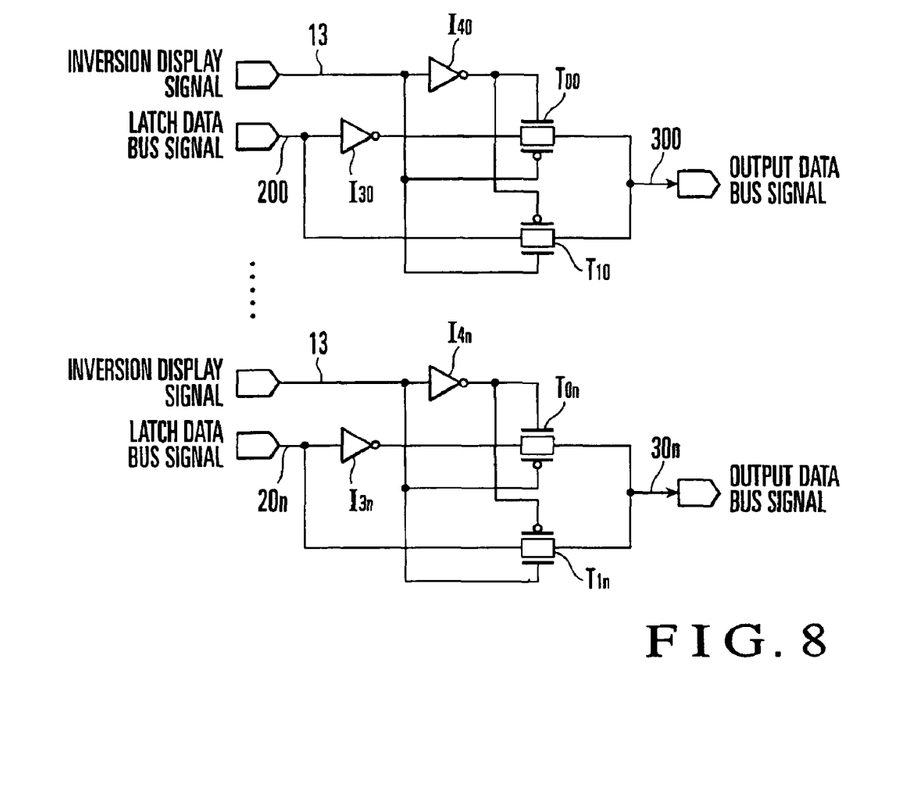
FIG. 8 is a circuit diagram showing an example of the data inversion control portion of the output data control circuit 3 in FIG. 6.
Figure 9:
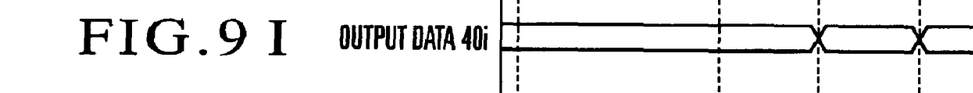
FIGS. 9A to 9I are timing charts showing the operation waveforms of blocks in FIG. 6.
Figure 9A:
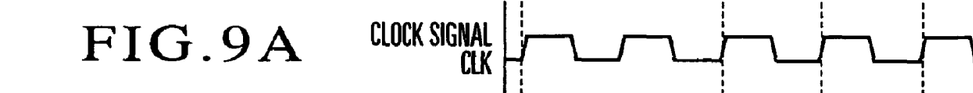
Figure 9B:
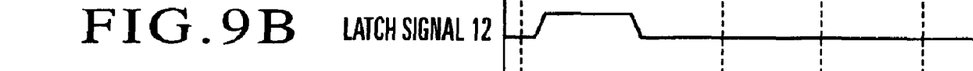
Figure 9C:
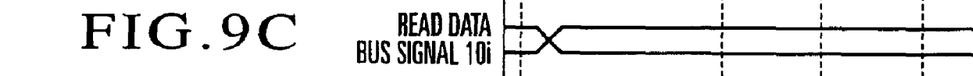
Figure 9D:
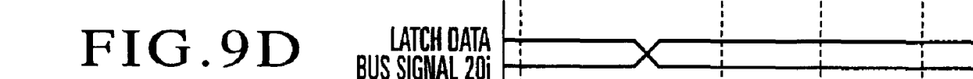
Figures 9E, 9F:
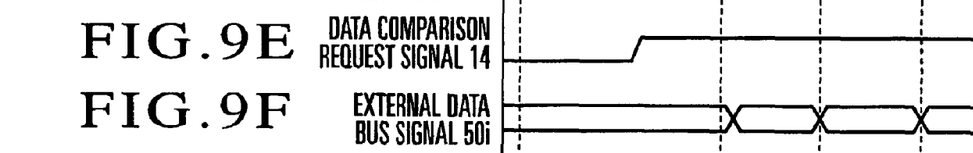
Figure 9G:
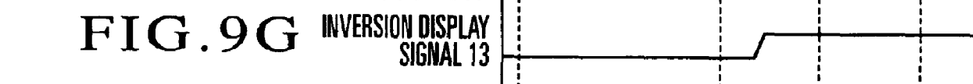
Figure 9H:
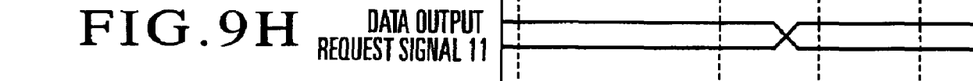

The clock signal CLK is supplied to a read data latch circuit 2, output data control circuit 3, and I/O control circuit 4, and these circuits operate in synchronism with the cycle of the clock signal. These circuits have the same arrangements as those shown in FIGS. 2 and 3. FIGS. 7 and 8 show circuit examples of the data comparison portion and data inversion control portion of the output data control circuit 3. These circuits are the same as those in FIGS. 3 and 4, and a description thereof will be omitted. In the comparison portion of FIG. 7, a data comparison request signal 14 and the clock signal CLK are supplied to an inversion display signal generation circuit 5.

Instead of the data output request signal 11 in FIG. 1, the clock signal CLK is input to the I/O circuit 4, and output data

40i is output onto the external data bus in synchronism with the clock signal CLK. FIGS. 9A to 9G show an example of the operation timing chart of signal waveforms at the portions of the blocks. T71 to T76 in FIGS. 9A to 9G represent the change timings of signals, and the portions of the blocks operate in synchronism with the clock signal CLK.

Also in this embodiment, similar to the above-described embodiment, data (data on the internal data bus) to be output to the external data bus is compared to previously output data. If the number of bits changed in the data exceeds half the total number of bits, the data on the internal data bus is inverted and output to the external data bus. At the same time, an inversion display signal representing whether the data has been inverted is also output.

In the above-described embodiment, bit comparison and inversion/non-inversion control are performed for all the bits of data on the external data bus. When the data width is large and the number of bits is large, data bus lines are classified into a plurality of groups, and bit comparison and inversion/non-inversion control are performed for each group.

Bit comparison and inversion/non-inversion control can be arbitrarily selected by external settings.

As has been described above, according to the present invention, when data of bits is to be output from the internal bus line to the external bus line, data currently present on the external data bus line and output data on the internal bus line are compared. If the number of bits changed in data exceeds half the total number of bits, the data is inverted. In addition, a signal representing that the inverted data is output is generated, and the inverted data and the signal (1 bit) representing this inversion are output.

More specifically, data on the internal data bus and data output onto the external data bus immediately before are compared bit by bit. When the number of data-inverted bits exceeds half the total number of bits, the data on the internal data bus is inverted and output to the external data bus.

Accordingly, the present invention can realize reduction of instantaneous current consumption generated by switching data in outputting data and reduction of noise generated by variations in power supply voltage.

The number of bits at which data are simultaneously switched can be decreased, reducing current consumption and noise generated by variations in power supply voltage. The effects are more prominent particularly when the number of output data of a memory is large and the number of changed data bits is large.

What is claimed is:

1. A data output circuit which outputs data on internal bus lines onto external bus lines, comprising:

comparison means for comparing data on groups of the external bus lines and data on corresponding groups of the internal bus lines;

inversion means for outputting inverted data obtained by inverting the data on a respective group of internal bus lines when the number of changed bits exceeds half the total number of bits in that group on the basis of an output result from said comparison means; and control means for outputting an inversion display signal representing that the data in a particular group has been inverted.

2. A circuit according to claim 1, wherein said comparison means, said inversion means, and said control means constitute an output data control unit.

3. A circuit according to claim 2, further comprising:

an amplifier which amplifies read data;

data latch means for latching data output from said amplifier; and input/output means for transmitting an output data bus signal from said output data control unit as output data onto the external data bus.

4. A circuit according to claim 3, wherein said input/output means feeds back the output data to said comparison means.

5. A circuit according to claim 3, further comprising clock signal supply means for supplying a clock signal to said data latch means, said output data control unit, and said input/output means.

6. A circuit according to claim 1, wherein the data on the internal bus lines includes data read out from storage means.

7. A data output method of outputting data on internal bus lines onto external bus lines, comprising the steps of:

arranging each of the internal and external bus lines into a plurality of corresponding groups, comparing data on each group of the internal bus lines to data on corresponding groups of external bus lines;

when the number of changed bits in a particular group exceeds half of the total number of bits in that group, on the basis of a comparison result, inverting the data on the particular group of internal bus lines to output the data onto the corresponding group of external bus lines; and outputting a data inversion signal representing that the data in the particular group has been inverted.

8. A method according to claim 7, wherein the comparison step comprises the step of receiving a clock signal.

9. A method according to claim 7, further comprising the step of reading out the data on the internal bus line from storage means.

* * * * *